United States Patent
Van Waasen et al.

(10) Patent No.: US 6,738,433 B1
(45) Date of Patent: May 18, 2004

(54) QUADRICORRELATOR FOR A DEMODULATOR FOR FREQUENCY-MODULATED SIGNALS

(75) Inventors: Stefan Van Waasen, Duisburg (DE); Guiseppe Li Puma, Bochum (DE)

(73) Assignee: Infineon Technologies AG, Munich (DE)

(*) Notice: Subject to any disclaimer, the term of this patent is extended or adjusted under 35 U.S.C. 154(b) by 513 days.

(21) Appl. No.: 09/607,321

(22) Filed: Jun. 30, 2000

(30) Foreign Application Priority Data

Jun. 30, 1999 (DE) .......................... 199 30 229

(51) Int. Cl.$^7$ .................. H04L 27/06; H03D 3/00
(52) U.S. Cl. .................. 375/316; 375/324; 329/300
(58) Field of Search .................. 375/343, 152, 375/329, 302, 303, 316, 323, 324; 329/315, 300

(56) References Cited

U.S. PATENT DOCUMENTS

| | | | | |
|---|---|---|---|---|
| 4,470,145 A | * | 9/1984 | Williams | 375/150 |
| 4,755,761 A | | 7/1988 | Ray, Jr. | |
| 5,048,058 A | * | 9/1991 | Kaleh | 375/274 |
| 6,151,367 A | * | 11/2000 | Lim | 375/326 |
| 6,549,564 B1 | * | 4/2003 | Popovic | 375/142 |

FOREIGN PATENT DOCUMENTS

| | | |
|---|---|---|
| DE | 37 07 762 A1 | 9/1988 |
| DE | 43 10 462 A1 | 10/1994 |
| EP | 0313126 * | 4/1989 ............ H03D/3/00 |
| EP | 0 405 676 A2 | 1/1991 |
| EP | 0 623 993 A2 | 11/1994 |
| GB | 2 210 743 A | 6/1989 |
| GB | 2210743 * | 6/1989 ............ H03G/3/20 |

OTHER PUBLICATIONS

Gardner, F.; Properties of Frequency Difference Detectors, Communications, IEEE Transactions on [legacy, pre–1988], vol.: 33 Issue: 2, Feb. 1985 Page(s): 131–138.*
Equalization Problems in a Digital FM Receiver (Kammeuer), dated 1985, Signal Processing 9, pp. 263–276, North Holland, as mentioned on p. 5 of the specification.
"Phaselock Techniques" (Gardner), dated 1979, pp. 84–87, as mentioned on p. 5 of the specification.
"Properties of Frequency Difference Detectors" (Gardner), dated Feb. 1985, IEEE Transaction Communications, vol. Com.33, No. 2, pp. 131–138, as mentioned on p. 2 of the specification.

* cited by examiner

Primary Examiner—Tesfaldet Bocure
Assistant Examiner—Qutbuddin Ghulamali
(74) Attorney, Agent, or Firm—Laurence A. Greenberg; Werner H. Stemer; Ralph E. Locher

(57) ABSTRACT

The quadricorrelator for a demodulator for frequency-modulated signals has a first input receiving an in-phase component of the signal and a second input receiving a quadrature component of the signal. The first and second inputs are followed by respective first and second multiplier units. The output of the first multiplier unit is connected with a positive sign, and the output of the second multiplier unit is connected with a negative sign to the output adder unit. The in-phase component is supplied via a first transfer function to the second multiplier unit, and the quadrature component is supplied via a second transfer function to the first multiplier unit. A demodulator characteristic formed between the input and output of the quadricorrelator cuts the frequency axis at a point where the frequency is nonzero and runs essentially linearly in a sufficiently wide frequency band which surrounds or is adjacent to the intersection point.

8 Claims, 3 Drawing Sheets

US 6,738,433 B1

QUADRICORRELATOR FOR A DEMODULATOR FOR FREQUENCY-MODULATED SIGNALS

BACKGROUND OF THE INVENTION

Field of the Invention

The invention lies in the electronics field. More specifically the invention relates to a quadricorrelator for a demodulator for frequency-modulated signals. The system is of the following type:

- a first input is provided for receiving an in-phase component of a signal to be demodulated, and a second input for receiving a quadrature component of the signal to be demodulated;
- the in-phase component and the quadrature component of the signal to be demodulated can be produced in a mixing stage that is connected upstream of the quadricorrelator;
- the first input of the quadricorrelator is followed by a first multiplier unit, and the second input is followed by a second multiplier unit, and the output of the first multiplier unit is connected with a positive sign to a first input of an output adder unit, and the output of the second multiplier unit is connected with a negative sign to a second input of the output adder unit; and
- the in-phase component which is supplied to the first input of the quadricorrelator is supplied with a first transfer function applied to it to the second multiplier unit, and the quadrature component is supplied with a second transfer function applied to it to the first multiplier unit, in each case as an input signal.

When frequency-modulation methods are used in transmission systems, such as DECT (Digital European Cordless Telecommunications standard), the signal which is modulated onto the carrier must be demodulated in the receiver chain after amplification and channel selection have been carried out. When a so-called low-IF structure (low intermediate-frequency structure) is used, the demodulation is normally carried out by means of a quadricorrelator whose demodulator characteristic is symmetrical about the frequency f=0. Such a quadricorrelator and its use in a demodulator are described, for example, in IEEE Trans. Comm. Volume COM-33, February 1985, pages 131–138. A frequency-modulated input signal is demodulated, in the structure used according to the published article, in such a way that the input signal is first of all split into two paths, with the signal in the one path being mixed with a signal in the form of a cosine wave at a specific frequency, and the signal in the other path being mixed with a signal in the form of a sine wave at the same frequency. The components of the spectrum of the mixed signal above the difference frequency are suppressed by means of a low-pass filter provided in each path. That signal path in which the input signal has been mixed with the signal in the form of a cosine wave then carries the in-phase component of the input signal, which is supplied to the first input of the actual quadricorrelator. In a corresponding way, the other signal path, in which the input signal has been mixed with the signal in the form of a sine wave, carries the quadrature component of the input signal, which is then supplied to the respective second input of the actual quadricorrelator.

The actual quadricorrelator then comprises a signal structure in which the in-phase component is differentiated in a straight-through path and is supplied to a multiplier. The quadrature component is likewise differentiated and is supplied to a further multiplier. The in-phase component is likewise supplied as an input signal to the further multiplier and the quadrature component is supplied as an input signal to the first multiplier. The output signal from the further multiplier, finally, is subtracted from the output signal from the first multiplier in order to obtain the output signal from the quadricorrelator, which corresponds to the demodulated signal.

The disadvantages of that implementation of the quadricorrelator include, firstly, the fact that the in-phase component and the quadrature component of the intermediate frequency obtained after the mixing of the input signal are not equal to zero and, thus, since the demodulator characteristic is symmetrical about the frequency f=0, the output signal has a constant offset superimposed on it. The offset is then normally removed in subsequent offset correction in order to compensate the influence of the intermediate frequency on such a demodulator characteristic during the demodulation process. This involves additional complexity.

Furthermore, the prior art configuration of a quadricorrelator has the disadvantage that, as a result of the differentiation of the in-phase component and the quadrature component in the straight-through paths through the quadricorrelator, which corresponds to multiplication of the relevant component by the transfer function of a high-pass filter in the frequency domain, the quadricorrelator has a wide noise bandwidth. With such a structure, the noise is filtered out only at very high frequencies, by virtue of the parasitic capacitances which are always present. Overall, this results in an adverse effect on the sensitivity of the quadricorrelator.

Finally, the property of the demodulator characteristic being symmetrical about the frequency f=0 results in the disadvantage that the linearity of the symmetrical demodulator characteristic must be maintained over a very wide bandwidth region about the mid-frequency f=0. This necessarily means that the demodulator characteristic must have a relatively low gradient, and thus low demodulation sensitivity as well.

The article "Equalization Problems on a Digital FM Receiver" by K. D. Kammeyer in Signal Processing 9(1985), pages 263–76 describes a digital receiver for frequency-modulated signals, which has digital equalizer networks and is suitable for use in FM sound radio receivers.

The article "Phaselock Techniques" by F. M. Gardner, John Wiley & Sons, New York 1979, pages 84–87 describes a quadri-correlator which operates as a difference-frequency detector.

SUMMARY OF THE INVENTION

The object of the invention is to provide a quadricorrelator for a demodulator for frequency-modulated signals which overcomes the above-noted deficiencies and disadvantages of the prior art devices and methods of this general kind, and which provides for a demodulator with better sensitivity.

With the above and other objects in view there is provided, in accordance with the invention, a quadricorrelator for a demodulator for frequency-modulated signals, comprising:

- a first input for receiving an in-phase component of a signal to be demodulated, and a second input for receiving a quadrature component of the signal to be demodulated;
- a first multiplier unit connected to the first input and having an output, and a second multiplier unit connected to the second input and having an output, an output adder unit having a first input connected with a positive sign to the output of the first multiplier unit, a second input connected with a negative sign to the output of the second multiplier unit, and an output forming an output of the quadricorrelator;

the second multiplier unit receiving as an input signal the in-phase component from the first input via a first transfer function, and the first multiplier unit receiving as an input signal the quadrature component from the second input via a second transfer function;

the first and second transfer functions being chosen such that a demodulator characteristic formed between the input of the quadricorrelator and the output of the output adder unit cuts a frequency axis at a point where the frequency is not zero and runs essentially linearly in a sufficiently wide frequency band surrounding or adjacent to the intersection point; and the first transfer function comprising a first transfer function element applied to the in-phase component, and a second transfer function element applied to an input signal to the first multiplier unit, wherein the signals weighted by the first transfer function element and the second transfer function element are added to generate an added signal forming the input signal to the second multiplier unit; and the second transfer function comprising a first transfer function element applied to the quadrature component, and a second transfer function element applied to the input signal to the second multiplier unit, wherein the signals weighted by the first transfer function element and the second transfer function element are added to generate an added signal forming the input signal to the first multiplier unit.

The invention is based on the knowledge that the demodulator characteristic can be shifted in the direction of the positive or negative frequency axis by respectively providing a transmission element with a first and a second transfer function in the crossing paths of the quadricorrelator and with the first and second transfer functions being chosen appropriately.

This results in the advantage that the intersection of the demodulator characteristic with the frequency axis is closer to the (positive) intermediate frequency of the in-phase component and quadrature component, respectively, of the signal to be modulated, and the bandwidth of the demodulator characteristic within which the linearity of the characteristic must be ensured may be chosen to be narrower. Correspondingly, the gradient of the demodulator characteristic in the linear region may be chosen to be higher, thus resulting in better demodulation sensitivity.

The crossing paths of the quadricorrelator have the following structure:

The first transfer function is split into a first transfer function element which is applied to the in-phase component, and a second transfer function element which is applied to the signal supplied to the first multiplier unit, with the signals, which have been weighted by the first and the second transfer function element, being added, and the added signal being supplied to the second multiplier unit, as an input signal. In the same way, the second transfer function comprises a first transfer function element which is applied to the quadrature component, and a second transfer function element which is applied to the signal supplied to the second multiplier unit, with the signals, weighted by the first and the second transfer function element, being added, and the added signal being supplied to the first multiplier unit, as an input signal.

This structure offers the advantage of simple circuitry design in order to shift the frequency of the demodulator characteristic.

In accordance with an added feature of the invention, the intersection of the demodulator characteristic is located at an intermediate frequency of the in-phase component and the quadrature component of the signal to be demodulated. That is, the transfer functions in the crossing paths of the quadricorrelator are chosen such that the intersection of the demodulator characteristic occurs at the carrier frequency or intermediate frequency of the in-phase component and of the quadrature component of the signal to be demodulated. For the reasons mentioned above, this results in maximum sensitivity. Furthermore, the demodulated signal does not require any offset correction in this preferred embodiment of the invention. This results in reduced circuitry complexity.

In accordance with an additional feature of the invention, the first transfer function element of the first transfer function is formed by a first low-pass filter—preferably a single RC element—and the first transfer function element of the second transfer function is formed by a second low-pass filter—preferably a single RC element as well.

In accordance with a preferred embodiment of the invention, the second transfer function element of the first transfer function is a first voltage-controlled current source having a voltage input receiving the signal being supplied to the first multiplier unit, and an output connected to a passive network, wherein one output voltage of the passive network represents the output signal of the second transfer function element of the first transfer function; the second transfer function element of the second transfer function is a second voltage-controlled current source having a voltage input receiving the signal being supplied to the second multiplier unit, and an output connected a passive network, wherein one output voltage of the passive network represents the output signal of the second transfer function element of the second transfer function.

In accordance with another feature of the invention, the second transfer function element of the first transfer function is equal to a negative of the second transfer function element of the second transfer function. This ensures that the demodulator characteristic has excellent linearity, without the output signal containing any higher-order components.

In accordance with a further feature of the invention, the first transfer function element of the first transfer function is equal to the first transfer function element of the second transfer function.

In accordance with a concomitant feature of the invention, the output of each of the voltage-controlled current sources is connected to the first transfer function element. That is, the outputs of each of the voltage-controlled current sources are connected to the transmission element which produces the first transfer function element.

This results in the advantage that there is no need to provide a separate adder in the crossing paths. The addition results from the fact that the current produced by the voltage-controlled current sources in each case flows through the preferably passive network of the transmission element which produces the first transfer function element. Thus, due to the superposition principle, the added voltage which is produced by the added currents appears at the output of this transmission element, with the one portion of the current being produced by the voltage-controlled current source and the other portion of the current being produced by the voltage, which is present at the input of the transmission element, of the in-phase component and quadrature component.

Other features which are considered as characteristic for the invention are set forth in the appended claims.

Although the invention is illustrated and described herein as embodied in a quadricorrelator for a demodulator for frequency-modulated signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
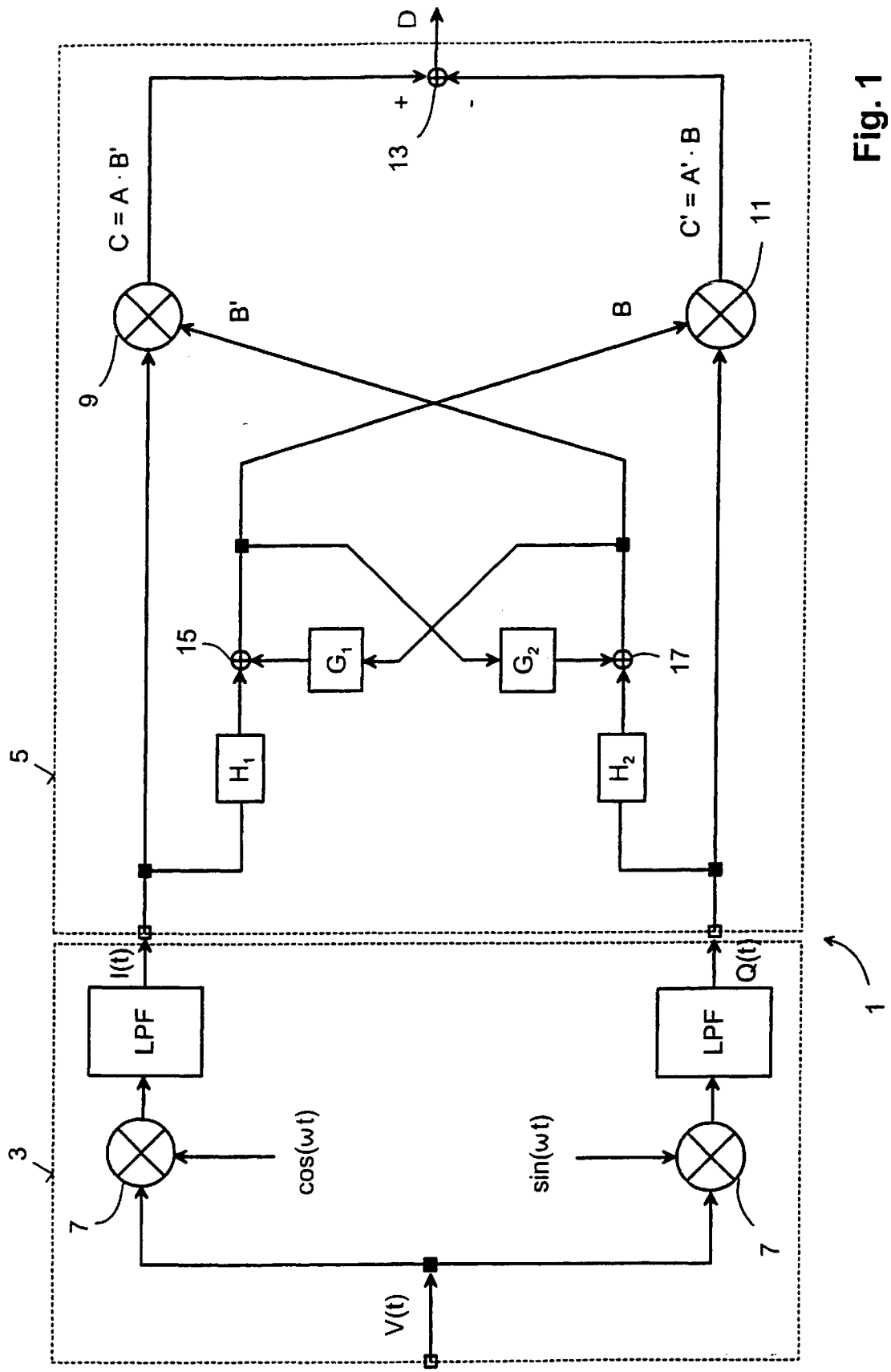
FIG. 1 is a schematic signal flowchart of a quadricorrelator according to the invention.

Referring now to the figures of the drawing in detail and first, particularly, to FIG. 1 thereof, there is seen a demodulator device 1 which comprises a mixing circuit 3 and a quadricorrelator 5 downstream from it. The mixing circuit 3 is supplied with a frequency-modulated signal V(t) that is to be demodulated. The mixing circuit 3 comprises two path elements, with each path element comprising a multiplier unit 7 and a low-pass filter LPF.

The upper path of the mixing circuit 3 illustrated in FIG. 1 is used to produce an in-phase component I(t) of the frequency-modulated input signal V(t). To this end, the input signal V(t) is multiplied by a signal cos(ωt), in the form of a cosine wave, by means of the multiplier unit 7. A mixed signal is then produced as the output signal, which has components at the difference frequency $\omega_0-\omega$ and further mixing products at the sum frequency $\omega_0+\omega$. The low-pass filter LPF downstream from the multiplier unit 7 is designed such that only components at the difference frequency $\omega_0-\omega$ appear at the output of the low-pass filter and, in consequence, form the in-phase signal or the in-phase component I(t). In this analysis, it has been assumed that the input signal V(t) is a signal in the form of a cosine wave, proportional to cos(ωt). In the same way, the lower path of the mixing circuit 3 illustrated in FIG. 1 comprises the multiplier unit 7 which, however, is supplied with a signal sin(ωt) in the form of a sine wave. In consequence, both components at the difference frequency $\omega_0-\omega$ (and components at the sum frequency $\omega_0+\omega$ are produced at the output of the multiplier unit 7. The low-pass filter LPF is once again designed such that only the components at the difference frequency are produced at the output of the low-pass filter and form the quadrature component Q(t). Assuming that the input signal V(t) is in the form of a cosine wave, the quadrature component Q(t) thus comprises a signal in the form of a sine wave, at the difference frequency $\omega_0-\omega$.

The in-phase component I(t) and the quadrature component Q(t) are each supplied to one input of the quadricorrelator 5.

The quadricorrelator 5 in each case comprises a straight-through path for the in-phase component I(t) and the quadrature component Q(t), with a multiplier unit 9 or 11, respectively, being located in each straight-through path. An output signal C from the multiplier unit 9 in the straight-through path for the in-phase component I(t) is passed with a positive sign to an output adder unit 13. An output signal C' from the multiplier unit 11 in the straight-through path for the quadrature component Q(t) is passed with a negative sign to the output adder unit 13. An output signal D=C−C' is thus generated at the output of the output adder unit 13, which forms the output of the demodulator device 1, and of the quadricorrelator 5.

Furthermore, the quadricorrelator 5 comprises two crossing paths, with the one path extending from the input for the in-phase component I(t) to the straight-through path for the quadrature component, and the other path extending from the input for the quadrature component to the straight-through path for the in-phase component. The output signal B from the cross path originating at the input for the signal I(t) to the straight-through path for the signal Q(t) is supplied as an input signal to the multiplier unit 11. Similarly, the output signal B' of the cross path from the input for the signal Q(t) to the straight-through path for the signal I(t) is supplied as an input signal to the multiplier unit 9.

In consequence, the designation of the output signal from the multiplier unit 9 is C=A·B', and that for the output signal from the multiplier unit 11 is C'=A'·B.

In each of the crossing paths, the respective input signal I(t) or Q(t) has a first respective transfer function element $H_1$ or $H_2$ applied to it, and the output signal from the transmission elements which produce the transfer function elements are supplied to a respective adder unit 15 or 17. The adder unit 15, to which the signal I(t) having the transfer function element $H_1$ applied to it is supplied, is also supplied, as a further input signal, with the output signal B', to which a second transfer function element G, of this cross path is applied, of the respective other cross path. In the same way, the adder unit 17 is supplied, as a further input signal, with the output signal B, to which a second transfer function element $G_2$ of this cross path is applied, of the relevant other cross path. This results in the two cross paths being coupled.

When calculating the demodulator characteristic, that is to say the relationship between the output signal D and the frequency of the in-phase component I(t) or the quadrature component Q(t), it is evident that components at twice the input frequency, which result from the multiplication in the straight-through paths, disappear in a desirable manner if the second transfer function elements $G_1$ and $G_2$ are chosen such that $G_1=-G_2$. This is true at least on the simplifying assumption that the first transfer function elements $H_1$ and $H_2$ are chosen to be identical, so that $H_1=H_2$.

Subject to these preconditions, it can be shown that the output signal D (in the time domain) is proportional to the expression Re{H(Δω/[G(Δω)+j]} where Δω denotes the difference between the frequencies of the signals I(t) and Q(t) which results from the mixing process with the signals cos(ω)t and sin(ωt) when an input signal V(t) in the form of a cosine wave and at the frequency $\omega_0$ is applied. If the input signal V(t) is in the form of a pure cosine wave, the frequency $\omega_0$ results from the carrier frequency $\omega_T$ to which a constant frequency shift (with the right sign) is added, containing the value of the input signal, which is in this case constant. In this case, the frequency Δω of the signals I(t) and Q(t) may also be obtained as the sum of the intermediate frequency $\omega_T-\omega$ (and the signal-dependent constant.

Figure 2:
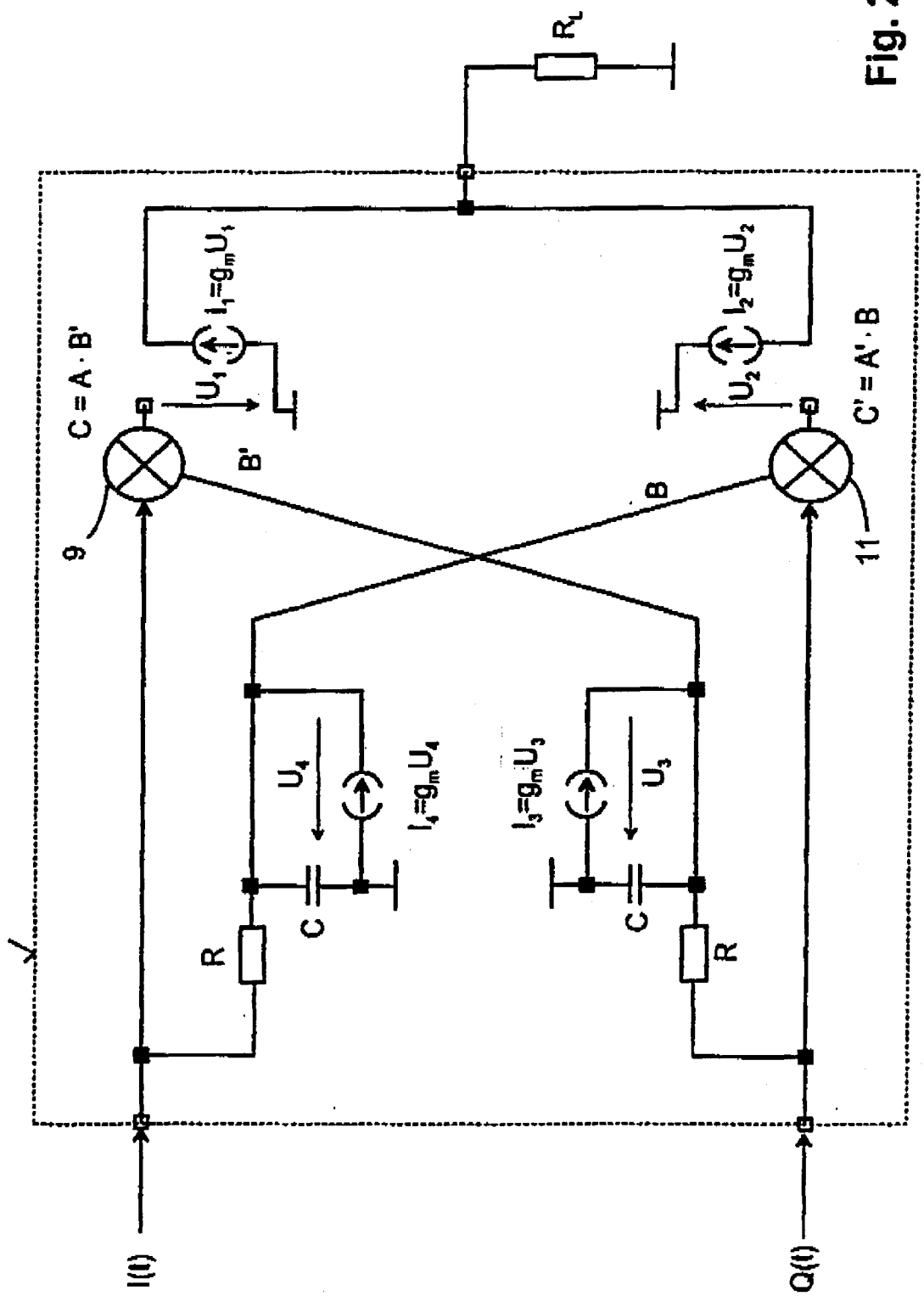
FIG. 2 is a circuit schematic of an exemplary circuitry implementation of an embodiment of the structure of FIG. 1.

FIG. 2 shows one possible circuitry implementation of the quadricorrelator 5 illustrated in FIG. 1. The transfer function elements were chosen as follows:

The first transfer function elements $H_1$ and $H_2$ are each provided by an RC element with the resistance values R and the capacitance values C. This is a passive, first-order low-pass filter.

The second transfer function elements $G_1$ and $G_2$ were in turn chosen on the basis of the condition $G_1=-G_2$ and were each in the form of a voltage-controlled current source 19, 21. The voltage-controlled current source 19 is controlled by a voltage $U_3$. The voltage $U_3$ is that voltage which is produced with respect to ground potential at the output of the RC element in the respective other cross path. The current $I_3$ produced by the voltage-controlled current source 19 is given by $I_3=g_m \cdot U_3$. The direction of the current $I_3$ is chosen such that the current $I_3$ flows exclusively into the output of the low-pass filter which is connected to the voltage-controlled current source. The transfer function $G_1=G$ is in consequence provided by the voltage-controlled current source 19 together with a downstream RC element, in which case, in the embodiment shown in FIG. 2, the RC element which provides the first transfer function element $H_1$ is at the same time used to provide the RC element for the transfer function G.

In the illustrated exemplary embodiment, the adder unit 15 is thus provided by the addition of the voltages at the output of the RC element (node between R and C), which are produced on the one hand by the current $I_3$ in the output and on the other hand by the voltage drop which is produced by the signal I(t) across the capacitance C of the RC element. Thus, in this specific case, there is no need for any separate active adder element.

The transfer function $H_2$ in the other cross path is likewise provided in a corresponding manner by an identical RC element. The voltage-controlled current source 21, which is connected to the output of the RC element, is driven by the voltage $U_4$ which is dropped across the output of the RC element in the other cross path to ground. The current $I_4$ which is produced by the voltage-controlled current source 21 is given by $I_4=g_m \cdot U_4$. The direction of the current $I_4$ is chosen such that it is passed from the output from the relevant RC element to ground potential.

The second transfer function element $G_2=-G$ is thus in turn provided by the voltage-controlled current source 21 and the RC element, which at the same time produces the transfer function $H_2$.

The two voltage-controlled current sources 19, 21 may be in the form of a gyrator, which couples the two crossing paths of the quadricorrelator at the output of the transfer functions $H_1$, $H_2$.

In the above analysis, it has been assumed that the inputs of the multiplier units 9, 11 have a sufficiently high impedance that the relevant input currents are negligibly small.

The output adder unit 13 in the signal flowchart shown in FIG. 1 was provided in the embodiment of FIG. 2 by the two voltage-controlled current-sources 23, 25, whose outputs are each connected to ground via the load resistor $R_l$. The voltage drop across the load $R_L$ thus corresponds to the added output voltages $U_1$ and $U_2$ from the two multiplier units 9 and 11. The negative sign for the voltage-controlled current source 25 was produced by appropriate choice of the direction of the output current $I_2$ with respect to the current $I_1$ from the voltage-controlled current source 23.

Figure 3:
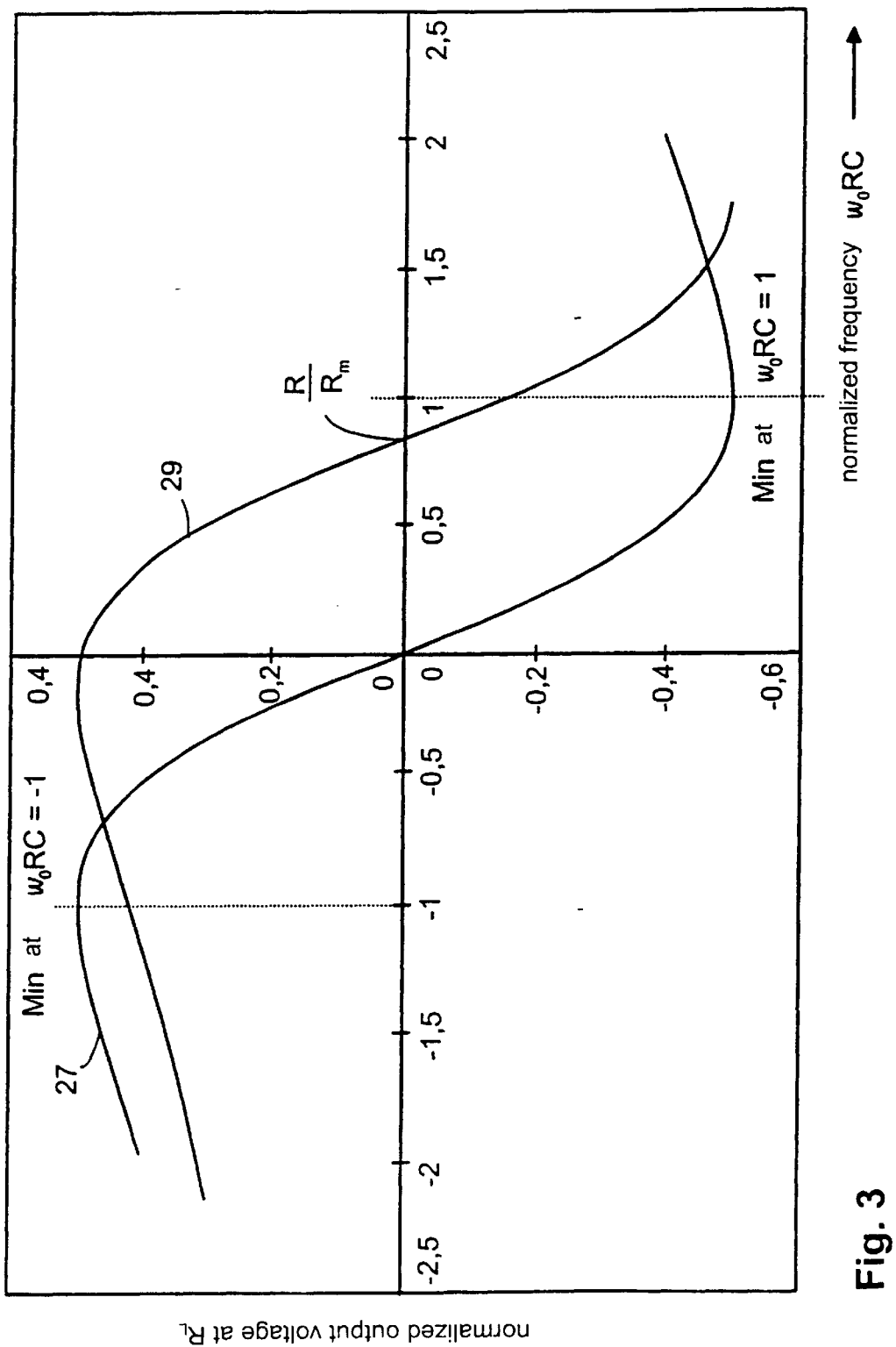
FIG. 3 is a graph showing the profile of two demodulator characteristics for the embodiment of FIG. 2.

FIG. 3 shows the demodulator characteristic for the embodiment shown in FIG. 2, on the one hand for the special case where there is no coupling whatsoever between the two cross paths, i.e., G=0 and $g_m$=0 (curve 27), and on the other hand for finite coupling between the two cross paths, that is to say G≠0 and $g_m$≠0 (curve 29).

Both curves are obtained from the following demodulator characteristic relationship, which applies to the circuit shown in FIG. 2:

$$D = \frac{-\left(\Delta\varpi + \frac{1}{R_M C}\right)RC}{1+\left[\left(\Delta\omega - \frac{1}{R_M C}\right)RC\right]^2}$$

The above relationship is a normalized form of the output voltage across the load $R_L$ as a function of an in-phase component I(t) which is in the form of a pure cosine wave and a quadrature component Q(t) which is in the form of a pure sine wave, at the frequency $\Delta\omega$.

As can be seen from FIG. 3, the curve 27 which represents the special case $g_m$=0 and $R_m \to \infty$ passes through the origin of the coordinate system, with the normalized frequency $\Delta\omega RC$ being plotted on the abscissa of this system, and the normalized output voltage across the load $R_L$ being plotted on its ordinate. Thus, in principle, the profile of the characteristic 27 is the same as the characteristics of known demodulators with the disadvantage mentioned initially that a wide linear range is required owing to the finite intermediate frequency $\omega_0-\omega$, in order to avoid distortion in the demodulation process. Furthermore, as already mentioned initially, with this characteristic profile, a unit for carrying out offset correction must be connected downstream from the modulator. This is because the characteristic 27 produces an output value which is not equal to zero if the intermediate frequency is not equal to zero.

The characteristic 29 illustrated in FIG. 2 is based on the above-mentioned relationship for values $R_m$≠0. In other words, there is finite coupling between the crossing paths in the quadricorrelator.

With the normalized frequency axis representation, the characteristic 29 is shifted to the right through the distance $R/R_m$ with respect to the origin. It can clearly be seen that the quadricorrelator according to the present invention operates optimally if the characteristic 29 intersects the abscissa at a point which corresponds exactly to the intermediate frequency $\omega_T-\omega$ of the input signals I(t) and Q(t). This is because there is no need for any subsequent offset correction in this case. Furthermore, this results in the advantage that the linearity region of the characteristic 29 is located optimally, so that minimal distortion can be achieved in the output signal.

It follows from the foregoing that the structure of the quadricorrelator shown in FIG. 1 allows such a frequency-shifted characteristic to be achieved. Although the mathematical model above is only shown for the relatively simple circuitry implementation shown in FIG. 2, it can be assumed that such a frequency shift can also be achieved with other transfer function elements $H_1$, $H_2$ and $G=G_1=-G_2$.

We claim:

1. A quadricorrelator for a demodulator for frequency-modulated signals, comprising:
 a first input for receiving an in-phase component of a signal to be demodulated, and a second input for receiving a quadrature component of the signal to be demodulated;
 a first multiplier unit connected to said first input and having an output, and a second multiplier unit connected to said second input and having an output, an output adder unit having a first input connected with a positive sign to said output of said first multiplier unit, a second input connected with a negative sign to said output of said second multiplier unit, and an output forming an output of the quadricorrelator;

said second multiplier unit receiving as an input signal the in-phase component from said first input via a first transfer function, and said first multiplier unit receiving as an input signal the quadrature component from said second input via a second transfer function;

the first and second transfer functions being chosen such that a demodulator characteristic formed between said input of the quadricorrelator and said output of said output adder unit cuts a frequency axis at a point where the frequency is not zero and runs essentially linearly in a sufficiently wide frequency band surrounding or adjacent to the intersection point; and wherein said first transfer function comprising a first, transfer function element applied to the in-phase component, and a second transfer function element applied to an input signal to said first multiplier unit, wherein signals weighted by said first transfer function element and said second transfer function element are added to generate an added signal forming the input signal to said second multiplier unit; and said second transfer function comprising a first transfer function element applied to the quadrature component, and a second transfer function element applied to the input signal to said second multiplier unit, wherein the signals weighted by said first transfer function element and said second transfer function element are added to generate an added signal forming the input signal to said first multiplier unit.

2. The quadricorrelator according to claim 1, wherein the intersection of the demodulator characteristic is located at an intermediate frequency of the in-phase component and the quadrature component of the signal to be demodulated.

3. The quadricorrelator according to claim 1, wherein said first transfer function element of said first transfer function is formed by a first low-pass filter, and said first transfer function element of said second transfer function is formed by a second low-pass filter.

4. The quadricorrelator according to claim 3, wherein said first low-pass filter and said second low-pass filter are RC elements.

5. The quadricorrelator according to claim 1, wherein:

said second transfer function element of said first transfer function is a first voltage-controlled current source having a voltage input receiving the signal being supplied to said first multiplier unit, and an output connected to a passive network, wherein one output voltage of said passive network represents the output signal of said second transfer function element of said first transfer function;

said second transfer function element of said second transfer function is a second voltage-controlled current source having a voltage input receiving the signal being supplied to said second multiplier unit, and an output connected a passive network, wherein one output voltage of the passive network represents the output signal of said second transfer function element of said second transfer function.

6. The quadricorrelator according to claim 5, wherein said output of each of said voltage-controlled current sources is connected to said first transfer function element.

7. The quadricorrelator according to claim 1, wherein said second transfer function element of said first transfer function is equal to a negative of said second transfer function element of said second transfer function.

8. The quadricorrelator according to claim 1, wherein said first transfer function element of said first transfer function is equal to said first transfer function element of said second transfer function.

* * * * *

UNITED STATES PATENT AND TRADEMARK OFFICE
CERTIFICATE OF CORRECTION

PATENT NO. : 6,738,433 B1
DATED : May 18, 2004
INVENTOR(S) : Stefan Van Waasen et al.

It is certified that error appears in the above-identified patent and that said Letters Patent is hereby corrected as shown below:

Title page,
Item [75], Inventors, should read as -- Stefan Van Waasen, Duisburg (DE) and Giuseppe Li Puma, Bochum (DE) --

Signed and Sealed this

Third Day of August, 2004

JON W. DUDAS
*Acting Director of the United States Patent and Trademark Office*